United States Patent
Chang

(10) Patent No.: US 8,072,826 B2
(45) Date of Patent: Dec. 6, 2011

(54) MEMORY CONTROL CIRCUIT AND MEMORY CONTROL METHOD

(75) Inventor: Tieh-Yen Chang, Tainan County (TW)

(73) Assignee: Himax Technologies Limited, Fonghua Village, Xinshi Dist., Tainan (TW)

( * ) Notice: Subject to any disclaimer, the term of this patent is extended or adjusted under 35 U.S.C. 154(b) by 71 days.

(21) Appl. No.: 12/629,894

(22) Filed: Dec. 3, 2009

(65) Prior Publication Data

US 2011/0134711 A1    Jun. 9, 2011

(51) Int. Cl.
*G11C 7/00* (2006.01)
(52) U.S. Cl. ..................... 365/193; 365/194
(58) Field of Classification Search .................. 365/193, 365/194
See application file for complete search history.

(56) References Cited

U.S. PATENT DOCUMENTS

| | | | |
|---|---|---|---|
| 6,205,046 B1* | 3/2001 | Maesako | 365/120 |
| 7,385,861 B1* | 6/2008 | Zhu | 365/194 |
| 2005/0007836 A1* | 1/2005 | Morzano et al. | 365/193 |
| 2008/0031079 A1* | 2/2008 | Osawa et al. | 365/233.1 |

\* cited by examiner

*Primary Examiner* — Huan Hoang
(74) *Attorney, Agent, or Firm* — Winston Hsu; Scott Margo

(57) ABSTRACT

A memory control circuit includes a data sample circuit, a first delay control circuit, a second delay control circuit and a data circuit. The data sample circuit is used for generating a first data strobe signal and a second data strobe signal. The first delay control circuit is coupled to the data sample circuit, for receiving the first data strobe signal and delaying the first data strobe signal to generate a first delayed data strobe signal. The second delay control circuit is coupled to the data sample circuit, for receiving the second data strobe signal and delaying the second data strobe signal to generate a second delayed data strobe signal. The data circuit is coupled to the first delay control circuit and the second delay control circuit, for transferring data signals according to the first delayed data strobe signal and the second delayed data strobe signal.

9 Claims, 3 Drawing Sheets

MEMORY CONTROL CIRCUIT AND MEMORY CONTROL METHOD

BACKGROUND OF THE INVENTION

1. Field of the Invention

The present invention relates to random access memory (RAM) control, and more particularly, to a memory control circuit and a related method.

2. Description of the Prior Art

With the development of the information technology industries, semiconductor component technologies progress rapidly. In order to increase the writing or reading speed of synchronous dynamic random access memory (SDRAM), double data rate (DDR) technology is introduced for related applications, where SDRAM utilizing DDR technology can be referred to as DDR SDRAM.

The data accessing of conventional SDRAM corresponds to a specific edge of each of a plurality of periods of a clock signal. For example, the specific edge is a rising edge. As the data accessing of DDR SDRAM corresponds to the rising and falling edges of each of a plurality of periods of a clock signal, the data accessing speed of DDR SDRAM is twice as fast as the data accessing speed of conventional SDRAM if their clock signals have the same frequency.

A data strobe signal differing from a clock signal can be applied to DDR SDRAM for data accessing, where the data strobe signal mentioned above is also referred to as the DQS signal, and the signal format thereof is well known in the art. As shown in FIG. 1, when a write command WR is outputted, a plurality of periodic pulses should occur in the data strobe signal DQS after the data strobe signal DQS enters a low level. The rising and falling edges of these periodic pulses can be utilized as time references for writing data D0, D1, D2, D3, etc. carried by the data signal DQ into memory cells of a memory. In addition, within the waveform of the data strobe signal DQS shown in FIG. 1, the portion corresponding to the low level occurring before the periodic pulses appearance is referred to as the preamble. Additionally, the time interval between a rising edge of the clock signal $V_{CLK}$ around the time point when the write command WR is issued and the first rising edge of the data strobe signal DQS around the end of the preamble is defined as $T_{DQSS}$.

When a memory circuit system operates at high frequencies, it is important to have the data strobe signal DQS that has a 50% duty cycle (as shown in FIG. 1). This provides the memory circuit system with approximately an equal amount of time on the high level phase and on the low level phase for transferring data into and out of the memory circuit system, such as latching rising edge data and latching falling edge data out of the memory circuit system. However, in some situations, a situation where the frequency of the clock signal $V_{CLK}$ is increased and the signal delay of some portions within the memory circuit system is not properly corrected, the data strobe signal DQS may not comply with a particular specification due to a duty cycle distortion. Once the periodic pulses of the data strobe signal DQS do not comply with a duty cycle defined by the specific specification mentioned above, the data carried by the data signal DQ cannot be guaranteed to be written into memory cells correctly.

SUMMARY OF THE INVENTION

It is therefore one of the objectives of the present invention to provide a memory control circuit and a related memory control method, to solve the above mentioned problems.

According to an embodiment of the present invention, a memory control circuit is disclosed. The memory control circuit includes a data sample circuit, a first delay control circuit, a second delay control circuit and a data circuit. The data sample circuit is used for generating a first data strobe signal and a second data strobe signal. The first delay control circuit is coupled to the data sample circuit, for receiving the first data strobe signal and delaying the first data strobe signal to generate a first delayed data strobe signal. The second delay control circuit is coupled to the data sample circuit, for receiving the second data strobe signal and delaying the second data strobe signal to generate a second delayed data strobe signal. The data circuit is coupled to the first delay control circuit and the second delay control circuit, for transferring data signals according to the first delayed data strobe signal and the second delayed data strobe signal.

According to another embodiment of the present invention, a memory control method is disclosed. The memory control method includes the following steps: generating a first data strobe signal and a second data strobe signal; delaying the first data strobe signal to generate a first delayed data strobe signal; delaying the second data strobe signal to generate a second delayed data strobe signal; and transferring data signals according to the first delayed data strobe signal and the second delayed data strobe signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
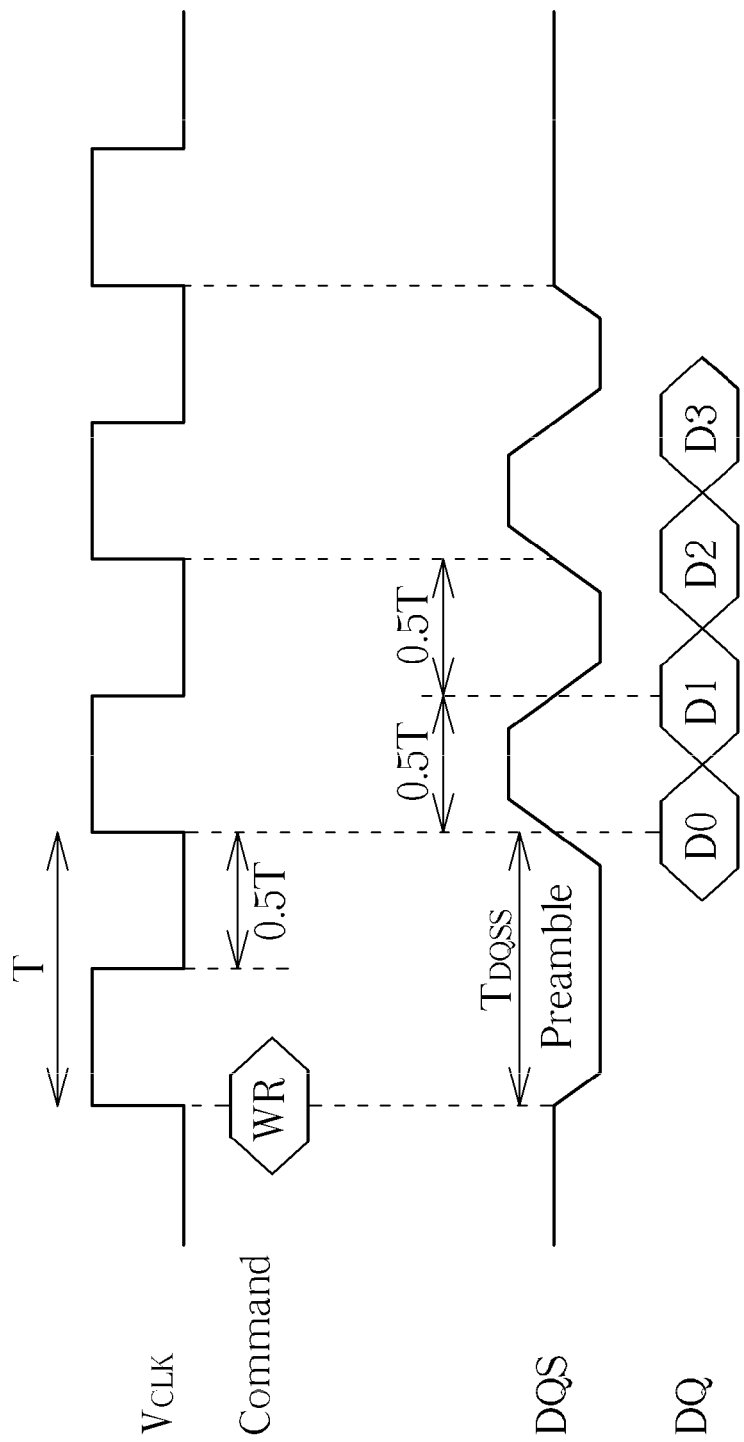
FIG. 1 is a diagram of a data strobe signal and a data signal according to the prior art.
Figure 2:
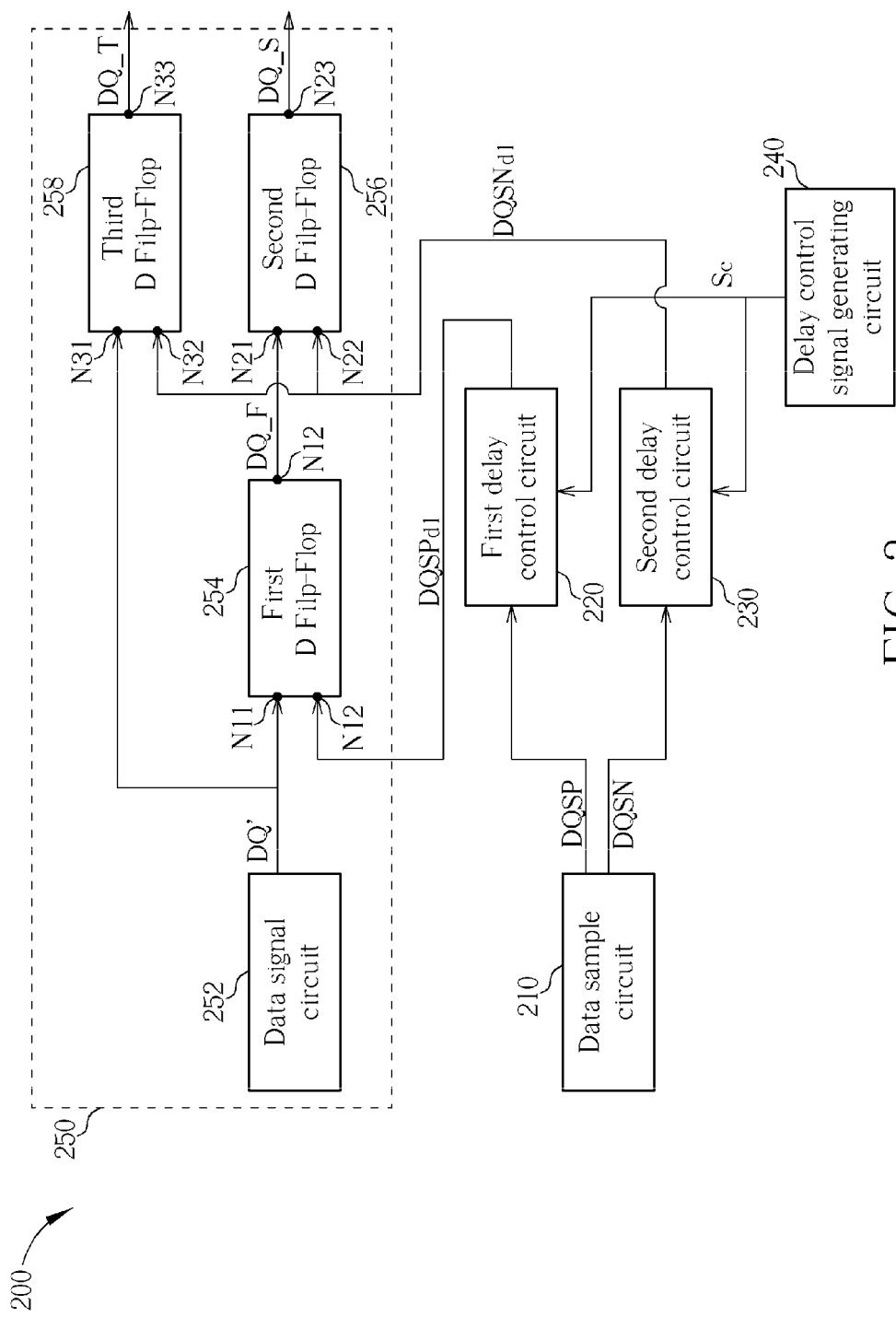
FIG. 2 is a diagram illustrating a memory control circuit according to an exemplary embodiment of the present invention.

Please refer to FIG. 2. FIG. 2 is a diagram illustrating a memory control circuit 200 according to an exemplary embodiment of the present invention. In this embodiment, the memory control circuit 200 includes, but is not limited to, a data sample circuit 210, a first delay control circuit 220, a second delay control circuit 230, a delay control signal generating circuit 240 and a data circuit 250. The data sample circuit 210 is used for generating a first data strobe signal DQSP and a second data strobe signal DQSN. The first delay control circuit 220 is coupled to the data sample circuit 210, for receiving the first data strobe signal DQSP and delaying the first data strobe signal DQSP to generate a first delayed data strobe signal $DQSP_{d1}$. The second delay control circuit 230 is coupled to the data sample circuit 210, for receiving the second data strobe signal DQSN and delaying the second data strobe signal DQSN to generate a second delayed data strobe signal $DQSN_{d1}$. The delay control signal generating circuit 240 is coupled to the first delay control circuit 220 and the second delay control circuit 230, for generating at least a delay control signal Sc, and then transmits the delay control signal Sc to control the delay time of the first delay control circuit 220 and the delay time of the second delay control circuit 230. The data circuit 250 is coupled to the first delay control circuit 220 and the second delay control circuit 230, for transferring data signal DQ' according to the first delayed data strobe signal $DQSP_{d1}$ and the second delayed data strobe signal $DQSN_{d1}$.

The data circuit 250 includes a data signal circuit 252, a first D flip-flop 254, a second D flip-flop 256 and a third D flip-flop 258. The data signal circuit 252 is used for outputting the data signal DQ'. The first D flip-flop 254 has a first node N11 coupled to the data signal circuit 252, a second node N12 coupled to the first delay control circuit 220 and a third node N13 for outputting a first output data signal DQ_F. The first D flip-flop 254 receives the data signal DQ' and the first delayed data strobe signal $DQSP_{d1}$, and then generates the first output data signal DQ_F according to the data signal DQ' and the rising edges of the first delayed data strobe signal $DQSP_{d1}$. The second D flip-flop 256 has a first node N21 coupled to the third node of the first D flip-flop 254, a second node N22 coupled to the second delay control circuit 230 and a third node N23 for outputting a second output data signal DQ_S. The second D flip-flop 256 receives the first output data signal DQ_F and the second delayed data strobe signal $DQSN_{d1}$, and then generates the second output data signal DQ_S according to the first output data signal DQ_F and the rising edges of the second delayed data strobe signal $DQSN_{d1}$. The third D flip-flop 258 has a first node N31 coupled to the data signal circuit 252, a second node N32 coupled to the second delay control circuit 230 and a third node N33 for outputting a third output data signal DQ_T. The third D flip-flop 258 receives the data signal DQ' and the second delayed data strobe signal $DQSN_{d1}$, and then generates the third output data signal DQ_T according to the data signal DQ' and the rising edges of the second delayed data strobe signal $DQSN_{d1}$.

In this embodiment, the data sample circuit 210 transmits the first data strobe signal DQSP and the second data strobe signal DQSN via a series stub terminated logic (SSTL) interface, and the data signal circuit 252 also transmits the data signal DQ' via an SSTL interface. The first delay control circuit 220 delays the first data strobe signal DQSP by ¼ clock signal time of the memory control circuit 200 to generate the first delayed data strobe signal $DQSP_{d1}$. The second delay control circuit 230 also delays the second data strobe signal DQSN by ¼ clock signal time of the memory control circuit 200 to generate the second delayed data strobe signal $DQSN_{d1}$. However, this embodiment merely serves as an example for illustrating features of the present invention, and should not be taken as a limitation to the scope of the present invention. In other words, the delay amounts used by the first delay control circuit 220 and the second delay control circuit 230 can be adjusted according to design requirements.

Figure 3:
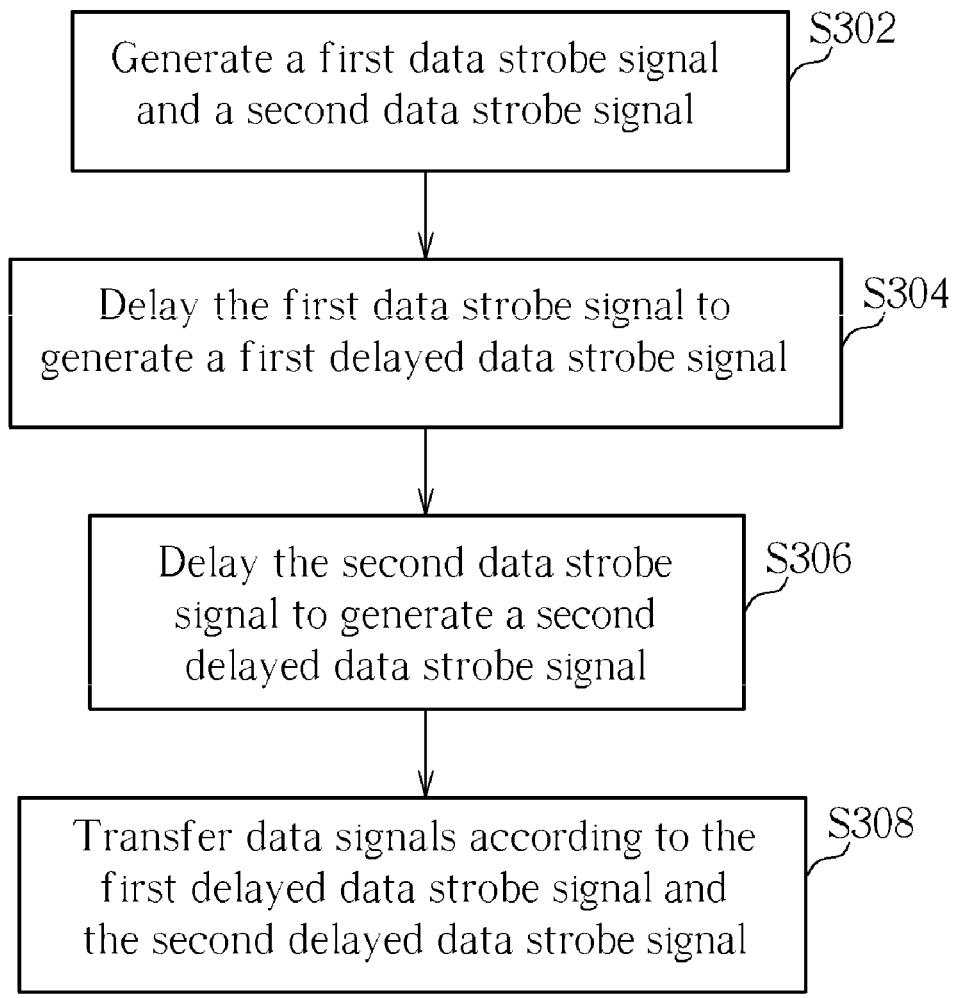
FIG. 3 is a flowchart illustrating a memory control method according to an exemplary embodiment of the present invention.

Please refer to FIG. 3. FIG. 3 is a flowchart illustrating a memory control method according to an exemplary embodiment of the present invention. The memory control method of the present invention can be applied to the memory control circuit 200 shown in FIG. 2. Please note that the following steps are not limited to be performed according to the sequence shown in FIG. 3 if a substantially identical result can be obtained. The exemplary method includes the following steps:

Step 302: Generate a first data strobe signal and a second data strobe signal.

Step 304: Delay the first data strobe signal to generate a first delayed data strobe signal.

Step 306: Delay the second data strobe signal to generate a second delayed data strobe signal.

Step 308: Transfer data signals according to the first delayed data strobe signal and the second delayed data strobe signal.

As those skilled in this art can easily understand the operations of steps 302-308 of the exemplary image processing method after reading the disclosure of the memory control circuit 200 shown in FIG. 2, full details are omitted here for brevity. Please note that, the steps of the flowchart mentioned above are merely a practicable embodiment of the present invention, and should not be taken as a limitation of the present invention. The method can include other intermediate steps or can merge several steps into a single step without departing from the spirit of the present invention.

In summary, exemplary embodiments of the present invention provide a memory control circuit and a memory control method. The memory control circuit generates two data strobe signals, and delays the two data strobe signals according to at least a delay control signal. Then, the memory control circuit outputs the data signals according to the rising edges of the two delayed data strobe signals. Thus, even though the two delayed data strobe signals have an unbalanced duty cycle, the data carried by the data signals can still be readout correctly.

Those skilled in the art will readily observe that numerous modifications and alterations of the device and method may be made while retaining the teachings of the invention.

What is claimed is:

1. A memory control circuit, comprising:
   a data sample circuit, for generating a first data strobe signal and a second data strobe signal, wherein the first data strobe signal is distinct from the second data strobe signal;
   a first delay control circuit, coupled to the data sample circuit, for receiving the first data strobe signal and delaying the first data strobe signal to generate a first delayed data strobe signal;
   a second delay control circuit, coupled to the data sample circuit, for receiving the second data strobe signal and delaying the second data strobe signal to generate a second delayed data strobe signal; and
   a data circuit, coupled to the first delay control circuit and the second delay control circuit, for transferring data signals according to the first delayed data strobe signal and the second delayed data strobe signal, wherein the data circuit comprises:
      a first D flip-flop (DFF), for generating a first output data signal according to the first delayed data strobe signal and a data signal;
      a second DFF, coupled to the first DFF, for generating a second output data signal according to the second delayed data strobe signal and the first output data signal; and
      a third DFF, for generating a third output data signal according to the second delayed data strobe signal and the data signal.

2. The memory control circuit of claim 1, wherein the data signals are DQ signals, and the first data strobe signal and the second data strobe signal are DQS signals.

3. The memory control circuit of claim 1, wherein the data circuit generates the data signals according to rising edges of the first delayed data strobe signal and the second delayed data strobe signal.

4. The memory control circuit of claim 1, wherein the data sample circuit transmits the first data strobe signal and the second data strobe signal via a series stub terminated logic (SSTL) interface.

5. The memory control circuit of claim 1, further comprising:
- a delay control circuit, coupled to the first delay control circuit and the second delay control circuit, for generating and transmitting at least a delay control signal to the first delay control circuit and the second delay control circuit, where the first data strobe signal and the second data strobe signal are delayed according to the delay control signal.

6. A memory control method, comprising:
- generating a first data strobe signal and a second data strobe signal, wherein the first data strobe signal is distinct from the second data strobe signal;
- delaying the first data strobe signal to generate a first delayed data strobe signal by inputting the first data strobe signal into a first delay control circuit;
- delaying the second data strobe signal to generate a second delayed data strobe signal by inputting the second data strobe signal into a second delay control circuit; and
- transferring data signals according to the first delayed data strobe signal and the second delayed data strobe signal, comprising:
  - utilizing a first D flip-flop (DFF) for generating a first output data signal according to the first delayed data strobe signal and a data signal;
  - utilizing a second DFF for generating a second output data signal according to the second delayed data strobe signal and the first output data signal; and
  - utilizing a third DFF for generating a third output data signal according to the second delayed data strobe signal and the data signal.

7. The memory control method of claim 6, wherein the data signals are DQ signals, and the first data strobe signal and the second data strobe signal are DQS signals.

8. The memory control method of claim 6, wherein the data signals are transmitted according to rising edges of the first delayed data strobe signal and the second delayed data strobe signal.

9. The memory control method of claim 6, further comprising:
- generating at least a delay control signal to delay the first data strobe signal and the second data strobe signal.

* * * * *